United States Patent [19]
Kuroda

[11] Patent Number: 4,733,283
[45] Date of Patent: Mar. 22, 1988

[54] GAAS SEMICONDUCTOR DEVICE

[75] Inventor: Shigeru Kuroda, Hadano, Japan

[73] Assignee: Fujitsu Limited, Kawasaki, Japan

[21] Appl. No.: 909,464

[22] Filed: Sep. 19, 1986

Related U.S. Application Data

[62] Division of Ser. No. 587,967, Mar. 9, 1984.

[30] Foreign Application Priority Data

Mar. 14, 1983 [JP] Japan .................. 58-42007

[51] Int. Cl.[4] .................. H01L 29/80; H01L 29/161; H01L 27/02
[52] U.S. Cl. ...................... 357/22; 357/16; 357/47; 357/55; 357/41
[58] Field of Search .................. 357/22 A, 22 MD, 42, 357/16, 41, 55, 47

[56] References Cited

U.S. PATENT DOCUMENTS

| | | | |
|---|---|---|---|
| 4,163,237 | 7/1979 | Dingle et al. | 357/22 A |
| 4,212,020 | 7/1980 | Yariv et al. | 357/41 |
| 4,471,366 | 9/1984 | Delagebeaudeuf et al. | 357/22 A |
| 4,503,600 | 3/1985 | Nii et al. | 357/22 A |
| 4,523,961 | 6/1985 | Hartman et al. | 357/63 |
| 4,545,109 | 10/1985 | Reichert | 357/15 |
| 4,559,547 | 12/1985 | Shiraki et al. | 357/16 |

FOREIGN PATENT DOCUMENTS 0064370 11/1982 European Pat. Off. .

OTHER PUBLICATIONS

Hadis Morkoc et al., "The HEMT: a Superfast Transistor", pp. 28 to 35, IEEE Spectrum, Feb. 1986.

Primary Examiner—James Carroll
Assistant Examiner—Ngan Ngo
Attorney, Agent, or Firm—Staas & Halsey

[57] ABSTRACT

A method of manufacturing a GaAS semiconductor device of an E/D construction having a GaAs/AlGaAs heterojunction and utilizing a two-dimensional electron gas, which includes the steps of forming a heterojunction semiconductor substrate and etching a portion of the substrate to provide a gate portion of a depletion-mode FET. When the substrate of a semi-insulating GaAs layer, an undoped GaAs, an N-type AlGaAs layer providing an electron-supply layer, and a GaAs layer is formed, the GaAs layer is composed of a first GaAs layer, an etching stoppable AlGaAs layer, and a second GaAs layer, the first GaAs layer being formed on the N-type GaAs layer. The etching for provision of the gate portion is carried out by a dry etching method using an etchant of $CCl_2F_2$ gas, so that the second GaAs layer can be etched but the AlGaAs layer cannot be etched. Thus, the thickness of the layers between a gate electrode of the depletion-mode FET and the GaAs/AlGaAs heterojunction plane is determined by the formation of the heterojunction substrate, and consequently a better uniformity of the threshold voltage of depletion-mode FET's is obtained.

6 Claims, 17 Drawing Figures

GAAS SEMICONDUCTOR DEVICE

This is a divisional of co-pending application Ser. No. 587,967 filed on Mar. 9, 1984.

BACKGROUND OF THE INVENTION

The present invention relates to a gallium arsenide (GaAs) semiconductor device comprising an enhancement-mode GaAs field effect transistor (FET) and a depletion-mode GaAs FET (referred to as an enhancement/ depletion (E/D) construction), more particularly to an improved method of manufacturing a GaAs semiconductor device of the E/D construction having a heterojunction and utilizing a two-dimensional electron gas.

Direct-coupled FET logic (DCFL) circuits having an E/D construction operate at a low power consumption and are suitable for high integration. Techniques for realizing such circuits by a compound semiconductor are being continually advanced. A simple example of a DCFL circuit is an inverter circuit having an E/D construction.

GaAs semiconductor devices having an E/D construction have been produced by using a GaAs-/aluminum gallium arsenide (AlGaAs) heterojunction semiconductor substrate (for example, European Patent Application No. 82302107.6, i.e., EP-A-0064370). In such GaAs semiconductor devices, the enhancement-mode FET and the depletion-mode FET can operate by utilizing a two-dimensional electron gas generated in the upper portion of an undoped GaAs layer adjoining an N-type AlGaAs layer, i.e., at the interface of the GaAs/AlGaAs heterojunction.

In order to form an enhancement-mode FET and a depletion-mode FET by using the GaAs/AlGaAs semiconductor substrate, it is necessary to obtain an active layer under a gate electrode of each of the FET's having a predetermined thickness. In this case, the active layer means a layer or layers lying between the gate electrode and the GaAs/AlGaAs heterojunction plane. A conventional heterojunction semiconductor substrate comprises a semi-insulating GaAs substrate, an undoped GaAs layer (high purity layer), an N-type AlGaAs layer (electron-supply layer), and an $N^+$-type GaAs layer (contact layer), which layers are formed in sequence on the GaAs substrate by a molecular beam epitaxy (MBE) method or a metal organic chemical vapor deposition (MOCVD) method. It is preferable to form an undoped AlGaAs layer between the undoped GaAs layer and the N-type AlGaAs layer, since the undoped AlGaAs layer serves as a buffer and contributes to increasing the electron mobility. For example, the heterojunction semiconductor substrate comprises the above layers having the following thicknesses and impurity concentrations.

| Layer | Thickness (nm) | Impurity concentration ($cm^{-3}$) |
| --- | --- | --- |
| Undoped GaAs | 300 | — |
| Undoped AlGaAs | 6 | — |
| N—type AlGaAs | 50 | $1 \times 10^{18}$ |
| N—type GaAs | 50 | $2 \times 10^{18}$ |

In order to form a gate portion of an enhancement-mode FET in the heterojunction semiconductor substrate, it is preferable to carry out selective etching of the N-type GaAs by just a dry etching method using a reactive gas of $CCl_2F_2$. In such selective etching, the etching automatically stops at the surface of the N-type AlGaAs layer. Therefore, an N-type AlGaAs layer having a predetermined thickness for formation of the enhancement-mode FET is formed, so that good uniformity of threshold voltage $V_{th}$ of enhancement-mode FET's simultaneously formed in a wafer can be attained.

On the other hand, in order to form a gate portion of a depletion-mode FET in the heterojunction semiconductor substrate, a portion of the N-type GaAs layer is etched by a wet chemical etching method so as to form the remaining thickness of the N-type GaAs layer and the thickness of the N-type AlGaAs layer thereunder into a predetermined thickness for formation of the depletion-mode FET. Although attempts have been made to accurately control the etch depth (i.e., the etched quantity) in wet etching, in practice, uniformity of etch depth of depletion-mode FETs simultaneously formed in a wafer is relatively low. Therefore, the uniformity of threshold voltage $V_{th}$ of the depletion mode FETs is also low.

SUMMARY OF THE INVENTION

An object of the present invention is to improve the uniformity of the threshold voltage $V_{th}$ of depletion-mode FETs of a GaAs semiconductor device having an E/D construction and produced by using a heterojunction semiconductor substrate.

Another object of the present invention is to provide a method of manufacturing a GaAs semiconductor device having an E/D construction in which etching treatments for adjusting the threshold voltages at both gate portions of an enhancement-mode FET and a depletion-mode FET are simultaneously performed under effective control.

Another object of the present invention is to provide a GaAs semiconductor device comprising an enhancement-mode GaAs FET having a heterojunction and utilizing a two-dimensional electron gas and a depletion-mode GaAs metal semiconductor (MES) FET utilizing no two-dimensional electron gas.

Another object of the present invention is to provide a GaAs semiconductor device comprising an enhancement-mode GaAs FET and a depletion-mode GaAs FET which have a heterojunction and utilize a two-dimensional electron gas.

The above and other objects of the present invention are attained by forming an AlGaAs thin layer as an etching stoppable layer in a GaAs layer lying on an N-type AlGaAs layer as an electron-supply layer, namely, forming a triple-layer structure comprising a first GaAs layer, the etching stoppable AlGaAs layer, and a second GaAs layer formed in sequence on the electron-supply AlGaAs layer. The etching treatment for forming the gate portions of an enhancement-mode FET and a depletion-mode FET is carried out by a selective dry etching method using an etchant which can etch GaAs but cannot substantially etch AlGaAs. As a result of such selective etching, the thickness of active layers between gate electrodes and the GaAs/AlGaAs heterojunction plane for the enhancement-mode FET and the depletion-mode FET are determined at the formation of the active layer.

BRIEF EXPLANATION OF THE DRAWINGS

The present invention and its objects and features will become apparent during the course of the detailed description set forth below, rendered with reference to the accompanying drawings, in which.

DESCRIPTION OF THE PREFERRED EMBODIMENTS

Figure 1:
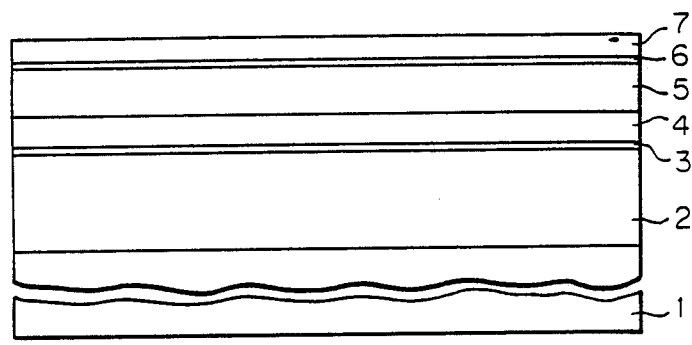
FIGS. 1 to 6 are schematic partially sectional views of a GaAs semiconductor device comprising an enhancement-mode FET utilizing two-dimensional electron gas and a depletion-mode MESFET in various stages of production in accordance with an embodiment of the present invention.

Referring to FIGS. 1 to 6, an explanation will be made of a process for manufacture of a GaAs semiconductor device comprising an enhancement-mode FET utilizing a two-dimensional electron gas and a depletion-mode MESFET not utilizing two-dimensional electron gas in accordance with a first embodiment of the present invention. As illustrated in FIG. 1, a heterojunction semiconductor substrate comprises a semi-insulating GaAs substrate (i.e., wafer) 1, an undoped GaAs layer 2, an undoped AlGaAs layer 3, an N-type AlGaAs layer 4, an N-type GaAs layer 5, an etching stoppable N-type AlGaAs layer 6, and a contact N-type GaAs layer 7, which layers are formed in sequence on the substrate 1 by an MBE method or an MOCVD method. It is possible to omit the undoped AlGaAs layer 3. The GaAs/AlGaAs heterojunction is formed with the undoped GaAs layer 2 and the undoped AlGaAs layer 3 (or the N-type AlGaAs layer 4). The N-type AlGaAs layer 4 serves as an electron-supply layer and has a thickness of from 25 to 60 nm, depending on the desired threshold voltage of the enhancement-mode FET and the impurity concentration thereof. The N-type GaAs layer 5 serves as an active layer of the depletion-mode GaAs MESFET. The thickness of the layer 5 depends on the desired threshold voltage of the depletion-mode GaAs MESFET and the impurity concentration thereof. The thickness of the etching stoppable $Al_yGa_{1-y}As$ layer 6 depends on the etching conditions and the mole ratio y of Al and is from 1 to 10 nm, preferably 3 to 6 nm.

For example, the heterojunction semiconductor substrate may comprise layers having the following thicknesses and impurity concentrations.

| Layer | | Thickness (nm) | Impurity concentration (cm$^{-3}$) |
|---|---|---|---|
| 2 | GaAs | 300 | — |
| 3 | AlGaAs | 6 | — |
| 4 | AlGaAs | 50 | $1 \times 10^{18}$ |
| 5 | GaAs | 100 | $1.8 \times 10^{17}$ |
| 6 | AlGaAs | 5 | $2 \times 10^{18}$ |
| 7 | GaAs | 50 | $2 \times 10^{18}$ |

Figure 2:
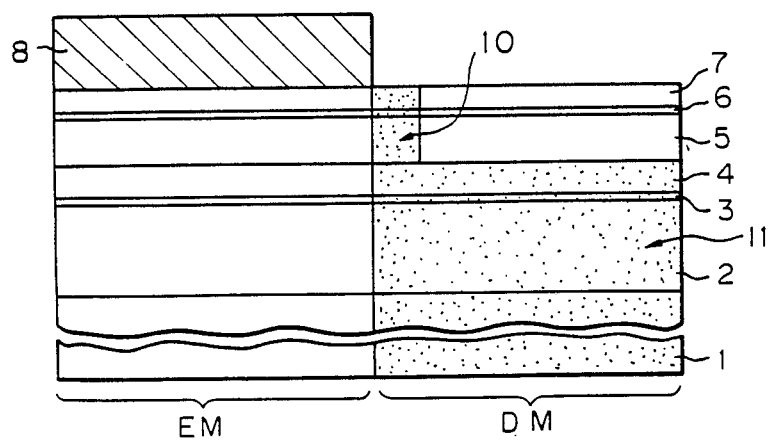

Next, a mask film 8 (FIG. 2) is formed on the heterojunction semiconductor substrate. For example, the mask film 8 may consist of a silicon dioxide (SiO$_2$) film having a thickness of approximately 200 nm and a titanium/gold (Ti/Au) film having a thickness of approximately 400 nm, be formed over the contact GaAs layer 7, and be selectively etched to form an opening (not shown) for a boundary region between a portion EM for the enhancement-mode heterojunction FET and a portion DM for the depletion-mode MESFET. Through the opening, oxygen ions or protons are shallowly doped into the hetero-junction semiconductor substrate by an ion-implantation method so as to change portions of the layers 7, 6, and 5 into an insulation region 10 (FIG. 2). Then, the mask film 8 is further selectively etched so as to remove the portion lying on the portion DM. Thus, the remaining mask film 8 lies on the portion EM, as illustrated in FIG. 2. Oxygen ions or protons are deep-doped by an ion-implantation method to change the part under the N-type GaAs layer 5 into an insulator region 11 (FIG. 2). As a result of the ion-implantation treatments, the insulator regions 10 and 11 isolate a portion for the formation of the depletion-mode MESFET in the portion DM.

Figure 3:
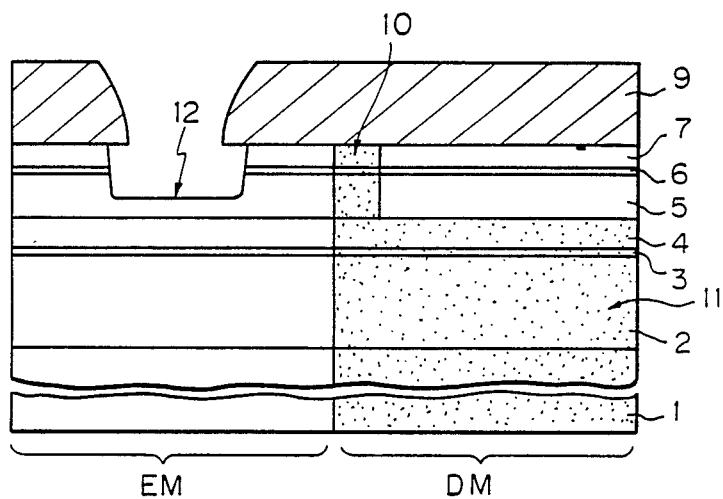

After the remaining mask film 8 is removed, another mask film 9 of, e.g., photoresist, is formed over the N-type GaAs layer 7 and is patterned to form an opening at a position for a gate of the enhancement-mode FET, as illustrated in FIG. 3. Through the opening, portions of the layers 7, 6, and 5 are selectively etched by a wet chemical etching method using, e.g., hydrofluoric acid (HF) to form a groove 12. In this etching treatment, it is necessary to remove the AlGaAs layer 6 and is preferable to make the remaining thickness of the GaAs layer 5 under the groove 12 similar to the thickness of the contact GaAs layer 7.

Figure 4:
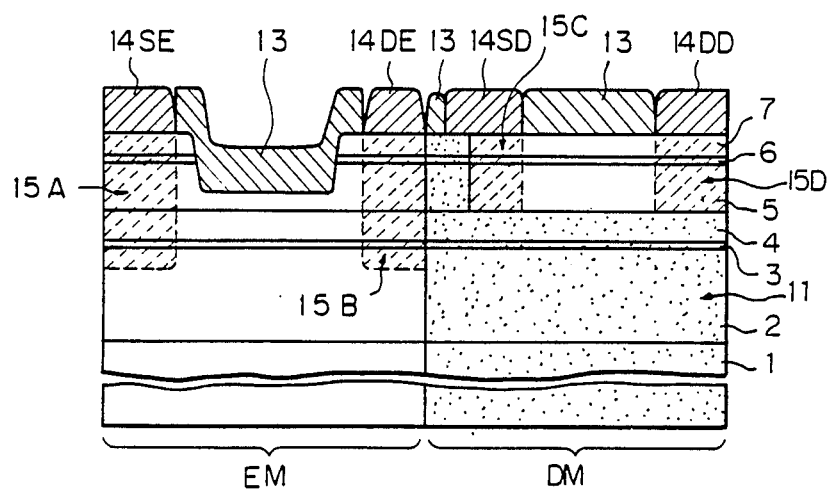

After the mask film 9 is removed, an SiO$_2$ film 13 (FIG. 4) is formed over the heterojunction semiconductor substrate by a reactive sputtering method or a chemical vapor deposition method. Another mask film (not shown) of photoresist is formed on the SiO$_2$ film 13 and is patterned. By using the patterned mask film, the SiO$_2$ film 13 is selectively etched by a suitable etching method to form source-electrode contact windows and drain-electrode contact windows, through which windows portions of the contact GaAs layer 7 are exposed. Retaining the patterned mask film, an electrode metal film is deposited on the exposed portions of the layer 7 and the mask film by a vacuum evaporation method, a sputtering method, or the like. The electrode metal film is preferably a multilayer of AuGe/Au, AuGe/Ni/Au, AuGe/Ni, or the like and has a thickness of, e.g., approximately 300 nm. When the photoresist mask film is removed by a solvent, a portion of the electrode metal film lying on the mask film is simultaneously removed to form source electrodes 14SE and 14SD and drain electrodes 14DE and 14DD, as illustrated in FIG. 4. Namely, the electrode metal film is patterned by a so-called lift-off method. Then, heat treatment for alloying (e.g., at approximately 450° C. for 1 minute) is carried out to form alloyed regions 15A, 15B, 15C, and 15D (FIG. 4).

Figure 5:
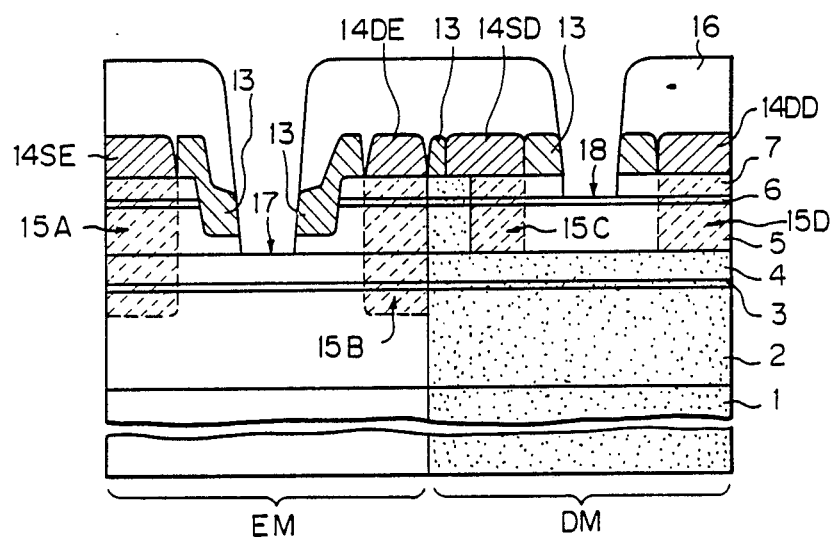
Figure 7:
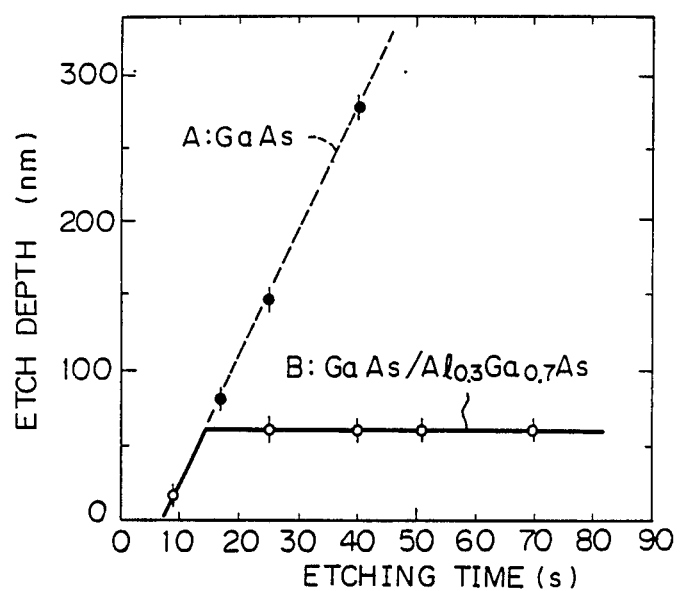
FIG. 7 is a graph showing the relationship between the etch depth and the etching time.

Next, another mask film 16 of photoresist is formed on the $SiO_2$ film 13 and the electrodes 14SE, 14DE, 14SD, and 14DD and is patterned to form openings at positions for gates of the enhancement-mode FET and the depletion-mode MESFET, as illustrated in FIG. 5. The $SiO_2$ film 13 is selectively etched by a suitable etching method such as a wet chemical etching method and a dry etching method, so that a portion of the GaAs layer 5 in the portion EM and a portion of the contact GaAs layer 7 in the portion DM are exposed in the openings. The exposed GaAs layers 5 and 7 are etched by a dry etching method using an etchant which can etch GaAs but cannot substantially etch AlGaAs, so that grooves 17 and 18 with AlGaAs bottoms are formed, as illustrated in FIG. 5. In this case, it is preferable to apply a reactive ion etching method using an etchant gas of $CCl_2F_2$ and a diluent or carrier gas of helium (He). For example, when dry etching of GaAs and $Al_{0.3}Ga_{0.7}As$ is carried out under the following conditions, the results shown in FIG. 7 are obtained and the etch rates of GaAs and $Al_{0.3}Ga_{0.7}As$ are 520 nm/min and 2 nm/min, respectively.

Power Density of Plasma Etching Apparatus: 0.18 $W/cm^2$
Pressure: 5 Pa
Used Gas: $CCl_2F_2$+He (at equal pressures)
Sample A: GaAs
Sample B: GaAs (60 mm thick)/$Al_{0.3}Ga_{0.7}As$ It is possible to use an etchant gas comprising a chlorine system gas and a fluorine system gas at a suitable mixing ratio.

Figure 6:
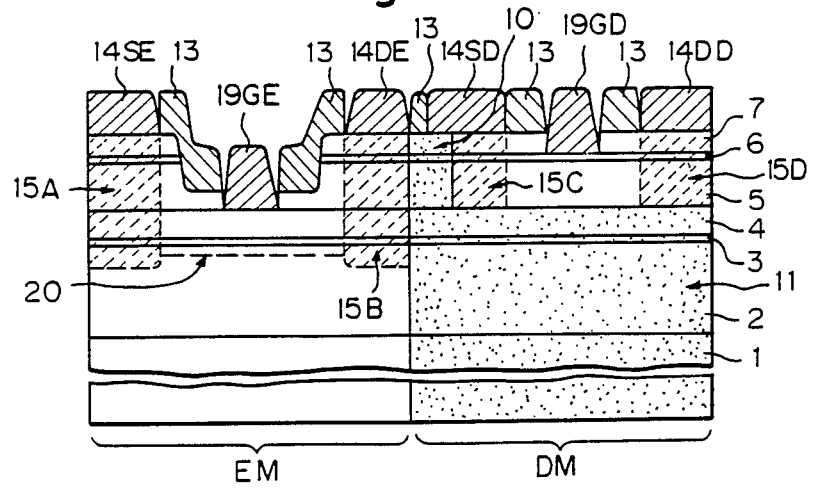

Retaining the mask film 16, another electrode metal film for gates is deposited on the exposed portions of the AlGaAs layers 4 and 6 and the mask film 16 by a vacuum evaporation method or a sputtering method. The electrode metal film is a multilayer of Ti/Pt/Au and has a thickness of, e.g., approximately 300 mm. The electrode metal film may be made of Al or a refractory metal silicide (e.g., $WSi_2$). When the mask film is removed by the solvent, the metal film is patterned by a lift-off method to form gate electrodes 19GE and 19GD, as illustrated in FIG. 6. Thus the enhancement-mode FET and the depletion-mode MESFET are formed in the portions EM and DM, respectively. When the enhancement-mode FET operates, a layer 20 of a two-dimensional electron gas is generated in the upper portion of the undoped GaAs layer 2 adjoining the GaAs/AlGaAs heterojunction plane. The exposed surfaces of the AlGaAs within the grooves 17 and 18 preferably are completely covered with the metal film for gates, i.e., the gate electrodes 19 GE and GD. Namely, the metal film serves as a metal seal so as to prevent the AlGaAs from oxidizing. AlGaAs is a very oxidizable material, and an oxide of the AlGaAs is apt to effect the surface concentration of the two-dimensional electron gas.

Figure 8:
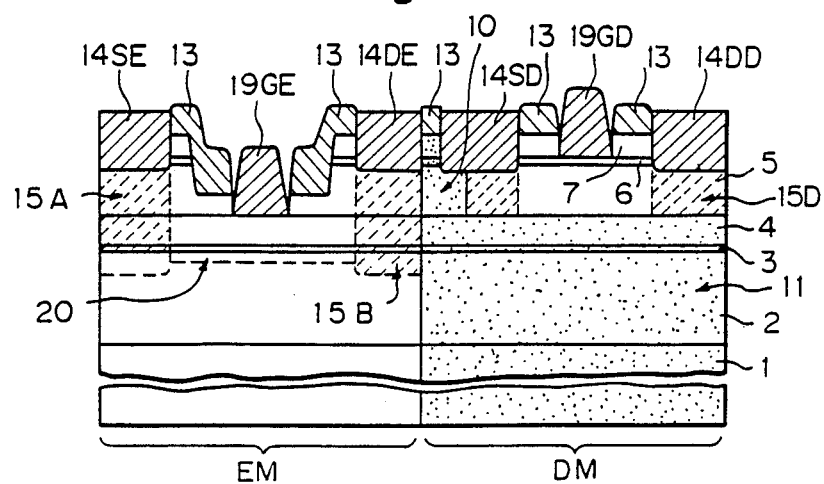
FIG. 8 is a schematic partially sectional view of a GaAs semiconductor device similar to that of FIG. 6.

FIG. 8 is a schematic partial sectional view of a GaAs semiconductor device comprising an enhancement-mode FET utilizing a two-dimensional electron gas and a depletion-mode MESFET similar to that of FIG. 6 but according to a second embodiment of the invention. Portions in FIG. 8 the same as those in FIGS. 1 to 6 are referenced by the same numerals. The GaAs semiconductor device is manufactured in accordance with the manufacturing process mentioned in the first embodiment, except for the addition of an etching step prior to the deposition of the electrode metal film for source and drain electrodes. Namely, after the formation of the source-electrode contact windows and the drain-electrode contact windows in the $SiO_2$ film 13, the exposed contact GaAs layer 7 and the etching stoppable AlGaAs layer 6 are selectively etched by applying, e.g., a wet chemical etching method to form recesses in which portions of the N-type GaAs layer 5 are exposed. Thus, the source electrodes 14SE and 14SD and the drain electrodes 14DE and 14DD can come into contact with the N-type GaAs layer 5 containing no aluminum, and consequently the contact property of the electrodes is very good.

Figure 9:
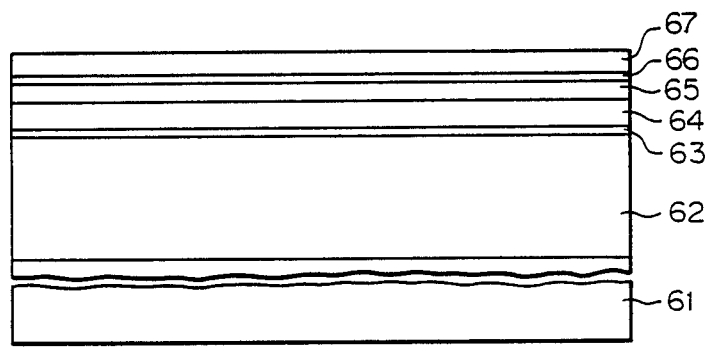
FIGS. 9 to 12 are schematic partially sectional views of a GaAs semiconductor device comprising an enhancement-mode FET and a depletion-mode FET, which utilize two-dimensional electron gas, in various stages of production in accordance with another embodiment of the present invention.

Referring to FIGS. 9 to 12, a process for manufacture of a GaAs semiconductor device comprising an enhancement-mode FET and depletion-mode FET, which utilize a two-dimensional electron gas, in accordance with a third embodiment of the present invention, will now be explained. As illustrated in FIG. 9, a heterojunction semiconductor substrate comprises a semi-insulating GaAs substrate 61, an undoped GaAs layer 62, an undoped AlGaAs layer 63, an N-type AlGaAs layer 64 of an electron-supply layer, a first GaAs layer 65, an etching stoppable AlGaAs layer 66, and a second GaAs layer 67, which layers are formed in sequence on the substrate 1 by an MBE method or an MOCVD method. It is possible to omit the undoped AlGaAs layer 63. The thickness of the electron-supply AlGaAs layer 64 is determined within the range of from 25 to 60 nm, depending on the desired threshold voltage of the enhancement-mode FET and the impurity concentration thereof. The thickness of the first GaAs layer 65 is determined within the range of from 20 to 200 nm, so as to attain the desired threshold voltage of the depletion-mode FET. The thickness of the layer 65 depends on the impurity concentration thereof. The thickness of the etching stoppable $Al_yGa_{1-y}As$ layer 66 depends on the etching conditions and the molar rate y of Al and is from 1 to 10 nm, preferably 3 to 6 nm. The layers 65, 66, and 67 preferably contain N-type impurities (e.g., silicon), so that they are N-type layers. It is possible to form the layers 65, 66, and 67 without doping of N-type impurities, thus they are i-layers.

For example, the heterojunction semiconductor substrate comprises the above layers having the following thickness and impurity concentration.

| | Layer | Thickness (nm) | Impurity concentration ($cm^{-3}$) |
|---|---|---|---|
| 62 | GaAs | 300 | — |
| 63 | Omitted | | |
| 64 | AlGaAs | 30 | $2 \times 10^{18}$ |
| 65 | GaAs | 5 | $1 \times 10^{18}$ |
| 66 | AlGaAs | 5 | $2 \times 10^{18}$ |
| 67 | GaAs | 50 | $2 \times 10^{18}$ |

Figure 10:
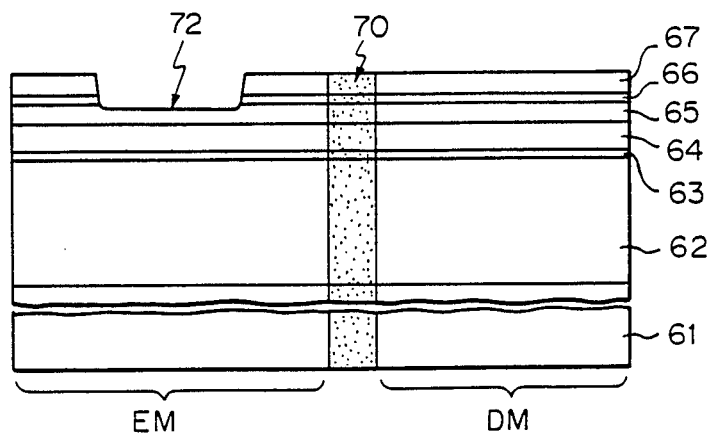

Next, a mask film (now shown) comprising an $SiO_2$ film and a Ti/Au film is formed on the second GaAs layer 67 and is selectively etched to form an opening at a boundary region between a portion for the enhancement-mode FET and another portion DM for the depletion-mode FET. Through the opening, oxygen ions or protons are doped into the heterojunction semiconductor substrate by an ion-implantation method, so as to form an isolation region 70, as illustrated in FIG. 10. After the mask film is removed, another mask film of photoresist is formed on the GaAs layer 67 and is patterned. Portions of the layers 67, 66, and 65 uncovered with the patterned mask film are selectively etched by a wet chemical etching method to form a groove 72 (FIG. 10). In this etching treatment, it is necessary to remove the AlGaAs layer 66, but the first GaAs layer 65 should not be completely removed.

Figure 11:
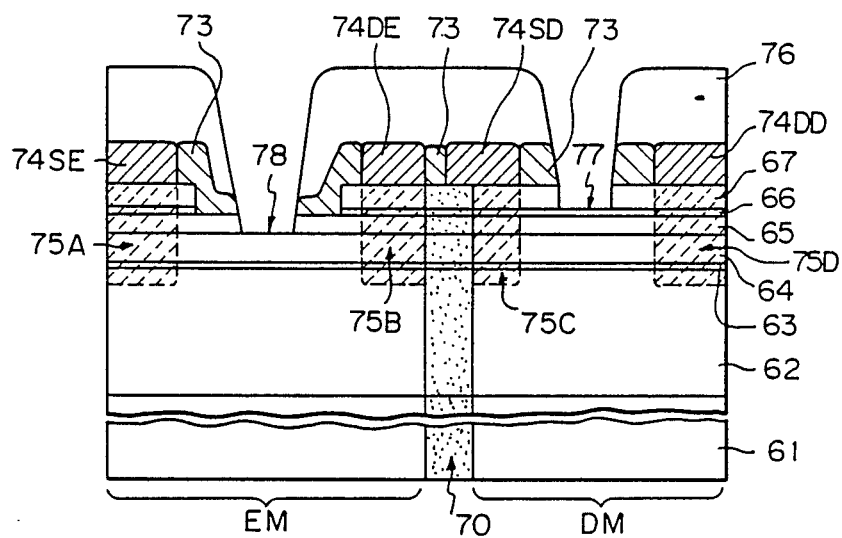

After the patterned mask film is removed, an $SiO_2$ film 73 (FIG. 11) is formed over the heterojunction semiconductor substrate and is patterned to form electrode contact windows. In the electrode contact windows, source electrodes 74SE and 74SD and drain electrodes 74DE and 74DD (FIG. 11) are formed in the manner mentioned in the first embodiment. Heat treatment for alloying is carried out to form alloyed regions 75A, 75B, 75C, and 75D. Then, another mask film 76 of photoresist is formed on the $SiO_2$ film 73 and is patterned, as illustrated in FIG. 11. The $SiO_2$ film 73 is selectively etched by a suitable etching method. Then, the second GaAs layer 67 and the first GaAs layer 65 are selectively etched by a dry etching method using an etchant ($CCl_2F_2$ gas) which can etch GaAs but cannot substantially etch AlGaAs, so as to form grooves 77 and 78 (FIG. 11), as mentioned in the first embodiment.

Figure 12:
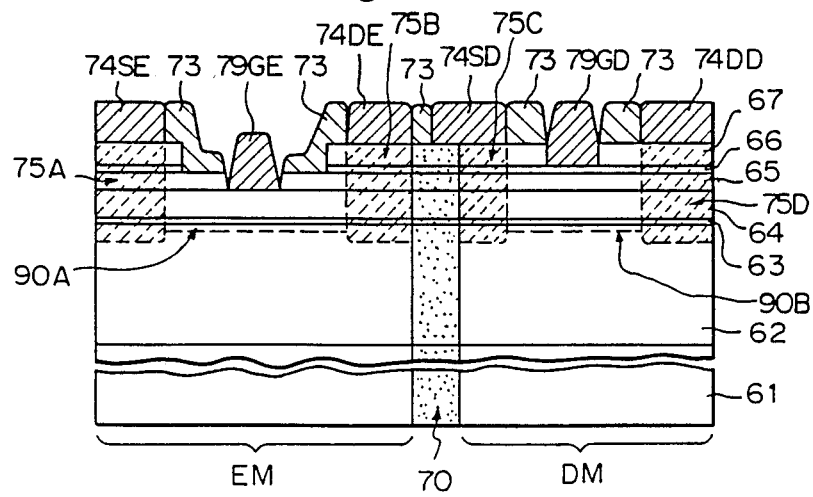

Next, another electrode metal film for gates is deposited on the photoresist mask film 76 and exposed portions of the AlGaAs layer 66 and 64 and is selectively removed by a lift-off method, as mentioned in the first embodiment, so that gate electrodes 79GE and 79GD are formed, as illustrated in FIG. 12. Thus, the enhancement-mode FET and the depletion-mode FET are formed in the portions EM and DM, respectively. When the enhancement-mode FET and the depletion-mode FET operate, layers 90A and 90B of two-dimensional electron gas are generated in the upper portion of the undoped GaAs layer 62 adjoining the GaAs/AlGaAs heterojunction plane.

Figure 13:
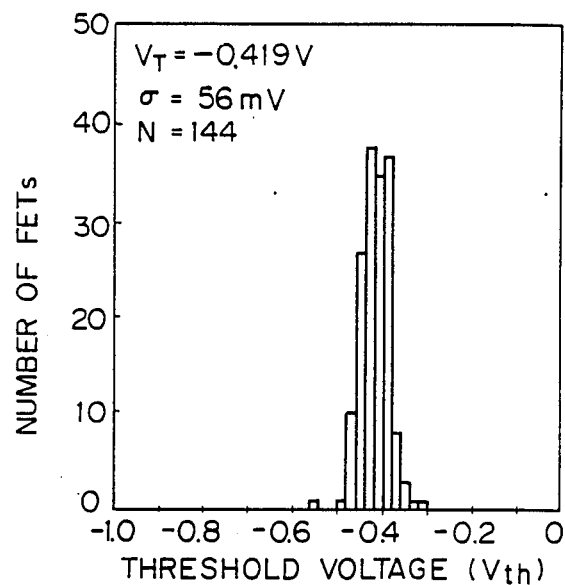
FIG. 13 is a graph of the distribution of the threshold voltages ($V_{th}$) of depletion-mode FET's formed in accordance with a method of the present invention.
Figure 14:
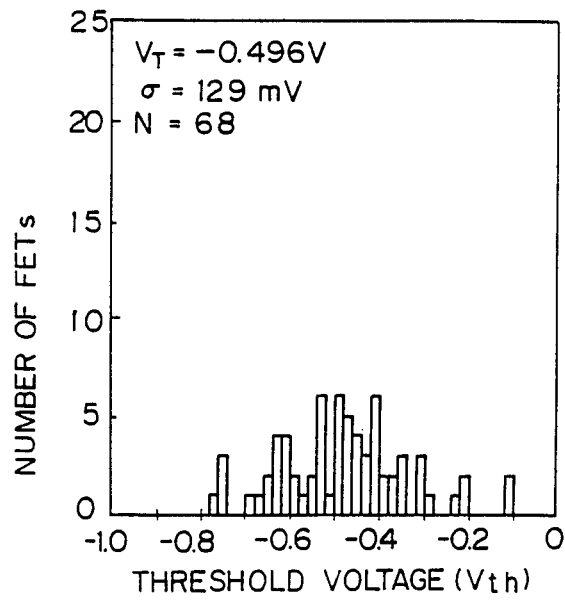
FIG. 14 is a graph of the distribution of the threshold voltages ($V_{th}$) of depletion-mode FET's formed in accordance with a conventional method.

In the case where many enhancement-mode FET's and depletion mode FET's are produced by using the above-mentioned heterojunction semiconductor substrate in accordance with the process of the third embodiment, an average threshold voltage $V_T$ of 0.77 V and a high uniformity of threshold voltage $V_{th}$ of the enhancement-mode FET's are obtained, and an average threshold voltage $V_T$ of $-0.419$ V and uniformity of threshold voltage $V_{th}$ shown in FIG. 13 of the depletion-mode FET's are obtained. The results of FIG. 13 are obtained from 144 depletion mode FET's. The standard deviation $\sigma$ of threshold voltage is 56 mV. As a comparative example, many depletion-mode FET's are formed by using a heterojunction semiconductor substrate without an etching stoppable AlGaAs layer. In this case, the results shown in FIG. 14 are obtained from 68 FET's. An average threshold voltage $V_T$ of approximately $-0.50$ V and a standard deviation $\sigma$ of 129 MV for the threshold voltage of the depletion-mode FET's are obtained as shown in FIG. 14. As is clear from FIGS. 13 and 14, the uniformity of threshold voltage of the depletion-mode FET's produced in accordance with the present invention is very superior to that of a conventional case.

Figure 15:
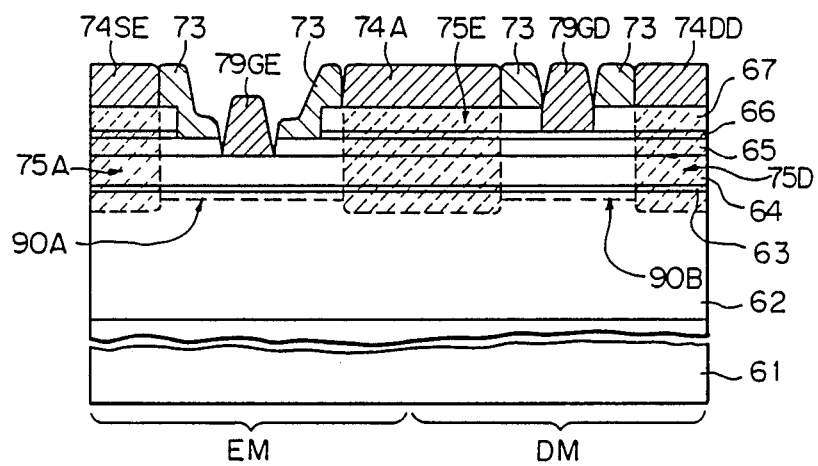
FIG. 15 is a schematic partially sectional view of a GaAs semiconductor device of an E/D construction inverter similar to that of FIG. 12.
Figure 16:
FIG. 16 is an inverter circuit.

FIG. 15 is a schematic partially sectional view of a GaAs semiconductor device of the inverter circuit of FIG. 16 having an E/D construction similar to that of FIG. 12, according to a fourth embodiment of the present invention. Portions in FIG. 15 the same as those in FIGS. 9 to 12 are indicated by the same reference numerals. The GaAs semiconductor device is produced in accordance with the production process mentioned in the third embodiment except that the formation of the isolation region 70 of FIG. 12 is not carried out and a common electrode 74A (FIG. 15) is formed instead of the electrodes 74DE and 74SD (FIG. 12).

Figure 17:
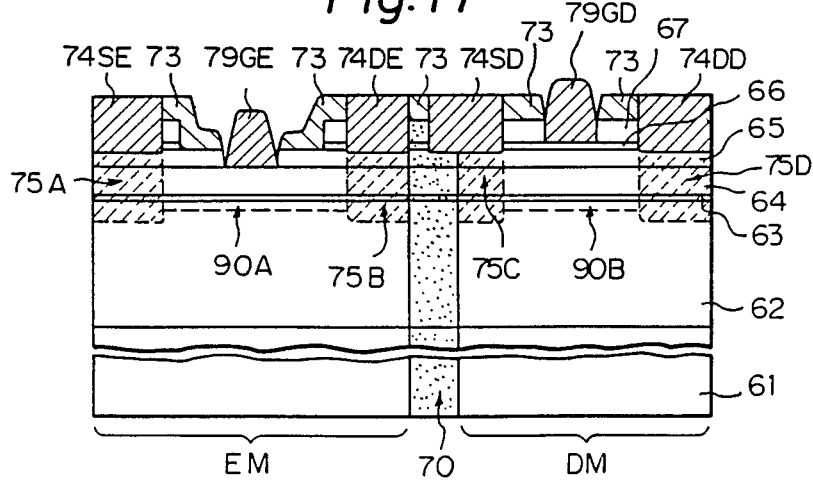
FIG. 17 is a schematic partially sectional view of a GaAs semiconductor device similar to that of FIG. 12.

FIG. 17 is a schematic partially sectional view of a GaAs semiconductor device having an E/D construction and similar to that of FIG. 12, according to a fifth embodiment of the present invention. Portions in FIG. 17 the same as those in FIGS. 9 to 12 are indicated by the same reference numerals. The GaAs semiconductor device is manufactured in accordance with the process mentioned in the third embodiment except for the addition of an etching step prior to the deposition of the electrode metal film for source and drain electrodes. Namely, after the formation of source-electrode contact windows and drain-electrode contact windows in the $SiO_2$ film 73, the exposed contact GaAs layer 67 and the etching stoppable AlGaAs layer 66 are selectively etched by applying, e.g., a wet chemical etching method to form recesses in which portions of the N-type GaAs layer 75 are exposed. Thus, the source electrodes 74SE and 74SD and the drain electrodes 74DE and 74DD can come into contact with the N-type GaAs layer 75 containing no aluminum and, consequently, the contact property of the electrodes is very good.

As mentioned above, according to the present invention, each element (FET) of an E/D construction semiconductor device as well as an E/D inverter having gate metal electrodes formed on the AlGaAs is provided. The compound semiconductor under the gate of the enhancement-mode FET comprises an AlGaAs layer, while that under the gate of the depletion-mode FET comprises an AlGaAs layer, a GaAs layer, and an AlGaAs layer. In case of the depletion-mode FET, the effects brought by forming a GaAs layer between the AlGaAs layers are a decrease of the contact resistance Rc an improvement of the mutual conductance gm. In seeing the operation of this type of FET, it is recognized that an electric route leads to an electrode through the AlGaAs layer and an alloyed contact layer from a channel portion directly under the gate beside another electric route leading to the electrode through the channel of the two-dimensional electron gas and the alloyed contact layer. The band gap of AlGaAs, for example, $Al_{0.3}Ga_{0.7}As$ is $\sim 1.7$ eV, which is larger than that ($\sim$ 1.4 eV) of GaAs, while the electric conductivity of AlGaAs is relatively low (e.g., its electron mobility is about 1/10th that of GaAs). The AlGaAs has impurities of a deep level which have a complex influence on electrical properties. Where a portion of the electron-supply AlGaAs layer is replaced with GaAS, the contact parasitic sheet resistance Rs in case of a gate width of 200 $\mu$m is 4 $\Omega$, which is smaller than that (10 $\Omega$) of a conventional case, which contributes to improvement of the mutual conductance gm. The contact resistance Rc is reduced by increasing the thickness of GaAs. Accordingly, a DCFL circuit having an E/D construction is formed by using the above-mentioned FET's utilizing a heterojunction, whereby the DCFL circuit has the above-mentioned features and a controlled threshold voltage Vth.

It will be obvious that the present invention is not restricted to the above-mentioned embodiments and that many variations are possible for persons skilled in the art without departing from the scope of the invention. For example, the isolation between an enhancement-mode FET and depletion-mode FET may be attained by forming a groove extending into an undoped GaAs layer through the GaAs/AlGaAs heterojunction instead of the insulator regions 10 and 11 (FIG. 6) or the isolation region 70 (FIG. 12).

In case of the above-mentioned embodiments, the grooves 17 and 18 (77 and 78) for gate electrodes are formed by a dry etching method. It is preferable to form both the grooves 17 and 18 (77 and 78) simultaneously in the dry etching step, as mentioned above. It is possible to carry out etching for the groove 17 and etching for the groove 18, respectively. Furthermore, it is possible to adopt a wet etching method instead of the dry etching, if selectivity and controllability of the wet etching method are good. For this case, the etching liquid should etch GaAs rapidly and AlGaAs slowly. Such an etching liquid includes a sulfuric acid system liquid and an ammonia system liquid. For example, the sulfuric acid system liquid may comprise $H_2SO_4:H_2O_2:H_2O = 95:5:5$, by volume ratio, and the ammonia system liquid may comprise $NH_3:H_2O_2 = 10:1$, by volume ratio. When GaAs and $Al_xGa_{1-x}As$ (x ranging from 0.3 to 0.05) are etched by using the above etching liquids, the etch rate of GaAs is about 10 times that of AlGaAs by controlling the $H_2O_2$ amount and etching temperature.

Although the heterojunction is formed by a combination of GaAs and AlGaAs in the above-mentioned embodiments, it is possible to use combinations of AlGaAs-Ge, GaAs-Ge, CdTe-InSb, GaSb-InAs, or the like for the heterojunction. According to the present invention, in a compound semiconductor layer having a large band gap, another semiconductor layer of which the etch rate is much slower than that of the compound semiconductor is formed. For the present time, however, a heterojunction of GaAs and AlGaAs is most preferable.

I claim:

1. A GaAs semiconductor device comprising an enhancement-mode FET and a depletion-mode FET which have a heterojunction and at least one of which utilizes a two-dimensional electron gas, said semiconductor device comprising:
    a semi-insulating GaAs substrate;
    an updoped GaAs layer formed on said semi-insulating GaAs substrate;
    an N-type AlGaAs layer formed on said undoped GaAs layer and including an exposed portion;
    a first N-type GaAs layer formed on said N-type AlGaAs layer and having a groove formed therein;
    an etching stoppable N-type AlGaAs layer formed on said first N-type GaAs layer;
    a second N-type GaAs layer formed on said etching stoppable N-type AlGaAs layer and having a groove formed therein;
    a gate electrode of said enhancement-mode FET self-aligningly filling the groove formed in said first GaAs layer and formed on an exposed portion of said N-type AlGaAs layer for providing an electron supply layer for said enhancement-mode FET; and
    a gate electrode of said depletion-mode FET for self-aligning filling a groove formed in said second N-type GaAs layer and formed on an exposed portion of said etching stoppable AlGaAs layer, said etching stoppable layer, said first GaAs layer and said N-type AlGaAs layer providing an electron supply layer for said depletion-mode FET, said gate electrode of said enhancement-mode FET and said gate electrode of said depletion-mode FET being formed simultaneously.

2. A device according to claim 1, wherein a drain electrode of said enhancement-mode FET and a source electrode of said depletion-mode FET are in common.

3. A device according to claim 1, wherein all the electrodes of both said FET's are separated from each other.

4. The device of claim 1, comprising an isolation region for isolating said FETSs from each other, said isolation region extending to include the portion of said N-type AlGaAs layer underneath said depletion-mode GaAs FET, wherein only said enhancement-mode FET utilizes said two-dimensional electron gas.

5. The device of claim 1, comprising an isolation region for isolating said FETs, said isolation region extending to said substrate, wherein both said FETs utilize a two-dimensional electron gas.

6. The device of claim 1, comprising two source and drain electrodes of said FETs being provided by a single electrode.

* * * * *

UNITED STATES PATENT AND TRADEMARK OFFICE
CERTIFICATE OF CORRECTION

PATENT NO.  : 4,733,283
DATED       : MARCH 22, 1988
INVENTOR(S) : SHIGERU KURODA

It is certified that error appears in the above-identified patent and that said Letters Patent is hereby corrected as shown below:

```
Col. 8, line 28, "75" should be --65--;

line 41, after "Rc" insert --and--.

Col. 10, line 35, "FETSs" should be --FETs--.
```

Signed and Sealed this

Twentieth Day of September, 1988

*Attest:*

DONALD J. QUIGG

*Attesting Officer*  *Commissioner of Patents and Trademarks*